United States Patent [19]

Uozu et al.

[11] Patent Number: 4,585,502
[45] Date of Patent: Apr. 29, 1986

[54] PROCESS FOR PRODUCING PRINTED CIRCUIT BOARD

[75] Inventors: Nobuo Uozu; Hiroyoshi Yokoyama; Yoichi Matsuda, all of Tochigi, Japan

[73] Assignee: Hitachi Condenser Co., Ltd., Tokyo, Japan

[21] Appl. No.: 701,533

[22] Filed: Feb. 14, 1985

[30] Foreign Application Priority Data

| Apr. 27, 1984 | [JP] | Japan | 59-85396 |
| May 2, 1984 | [JP] | Japan | 59-88956 |
| May 9, 1984 | [JP] | Japan | 59-92106 |
| May 22, 1984 | [JP] | Japan | 59-103375 |
| Jun. 26, 1984 | [JP] | Japan | 59-131459 |
| Jun. 29, 1984 | [JP] | Japan | 59-134195 |
| Jul. 31, 1984 | [JP] | Japan | 59-161320 |
| Jul. 31, 1984 | [JP] | Japan | 59-161321 |

[51] Int. Cl.⁴ .................. B32B 31/00; B05D 5/12; B44C 1/22; C23F 1/00
[52] U.S. Cl. ................... 156/278; 29/852; 156/645; 156/656; 156/666; 156/668; 156/902; 427/97; 427/302; 427/307
[58] Field of Search ............ 174/68.5; 29/852; 427/97, 98, 301, 302, 304–307; 156/252, 278, 630, 632, 634, 645, 656, 666, 902, 668

[56] References Cited

U.S. PATENT DOCUMENTS

| 3,322,881 | 5/1967 | Schneble et al. | 174/68.5 |
| 3,672,986 | 6/1972 | Schneble et al. | 156/901 X |
| 3,956,041 | 5/1976 | Polichette et al. | 156/629 |
| 4,339,303 | 7/1982 | Frisch et al. | 156/902 X |

*Primary Examiner*—William A. Powell
*Attorney, Agent, or Firm*—Antonelli, Terry & Wands

[57] ABSTRACT

A process for producing a printed circuit board characterized by forming a thermosetting resin layer on internal walls of through holes before an electroless plating treatment can produce printed circuit boards having high reliability without causing blow-holes on the through hole walls.

10 Claims, 21 Drawing Figures

PROCESS FOR PRODUCING PRINTED CIRCUIT BOARD

BACKGROUND OF THE INVENTION

This invention relates to a process for producing a printed circuit board by an additive process.

Up to now, in the production of printed circuit boards by forming a circuit by electroless plating according to the additive process such as a so-called CC-4 process, an adhesive layer containing a catalyst for plating is previously formed on the surface of an insulating substrate. In this case, the insulating substrate may contain a catalyst for plating in some cases and may not contain in other cases. Further, in the case of a printed circuit board in which the insulating substrate is provided with holes for through holes, a treatment of adhering a catalyst for plating to the hole surfaces is carried out after forming the holes and before carrying out electroless plating treatment.

Usually, in order to improve the adhesion between the adhesive layer and the circuit of deposited metal formed by electroless plating treatment, the adhesive layer is roughened after adhering the catalyst for plating to the hole surfaces. The adhesive layer is roughened by immersing the insulating substrate in a roughening solution such as borofluoric acid solution or chromic anhydride-sulfuric acid type solution, but a seeder (catalyst) adhered to the hole surface is washed off in a large amount by this immersion treatment. Therefore, there is the following disadvantages: when the electroless plating treatment is subsequently carried out, it takes a long time to deposit a metal on the hole surface portions, and the plated film deposited adhere locally and thinly, so that plating voids tend to be formed. Accordingly, for example, when a land is subjected to solder plating with a solder dip or the like or when an electronic part is connected to the printed circuit board, the gas in the insulating substrate is blown off through fine voides of the plated film on the hole walls into the holes to bring about a state wherein vacancies are formed in the solder (hereinafter referred to as "blow-hole"). If such a state is brought about, there are the following disadvantages. Bad connection of the electronic part becomes liable to occur and the adhesion becomes liable to lower.

For example, U.S. Pat. No. 3,322,881 discloses a process which comprises first drilling or punching through holes in an insulating substrate, coating the whole surface including the lateral walls surrounding the through holes with resinous ink containing a catalyst for plating to form a first circuit pattern, masking the first circuit pattern leaving the lateral walls surrounding the through holes exposed, thereafter forming a second circuit pattern in the same manner as with the first circuit pattern, and then conducting electroless plating. In this process, as the resinous ink containing a catalyst for plating, there is used a resinous ink which has a high solid content in order to increase its adhesion to the substrate and the metal for plating, and has a viscosity as high as 5 to 100 poises (20° C). Therefore, said process is disadvantageous in that the inner walls of the through holes cannot sufficiently be plated because the adhesion of the catalyst-containing resinous ink to the inner walls of the through holes becomes ununiform or in some cases, the holes are plugged. Further, the penetration of the ink into cracks formed on the through hole walls at the time of processing is insufficient, so that these defective portions cannot be repaired. Accordingly, said process is very insufficient in preventing the blow-holes. Further, said process also has the following disadvantage. When the catalyst-containing resinous ink is allowed to stand, the solvent such as xylene or diacetone alcohol volatizes, so that the ink increases in viscosity and lowers the workability, and the smaller the diameter of the through hole becomes, the more difficult becomes the ink to adhere to the through hole walls. Therefore, the process disclosed in this U.S. Patent is not suitable for the practical industrial production of printed circuit boards.

SUMMARY OF THE INVENTION

An object of this invention is to provide a process for producing a printed circuit board having high reliability which process is free from the above-mentioned disadvantages, facilitates the deposition of metal in the through holes, makes it possible to reduce the production time, and prevents blow-holes.

This invention provides a process for producing a printed circuit board by building up a circuit on an insulating substrate having through holes by electroless plating, characterized by forming an adhesive layer containing a catalyst for plating on one or both sides of the insulating substrate, forming through holes in the substrate, forming a thermosetting resin layer on the inner walls of the through holes, and then carrying out electroless plating treatment.

DESCRIPTION OF THE PREFERRED EMBODIMENTS

Figure 1:
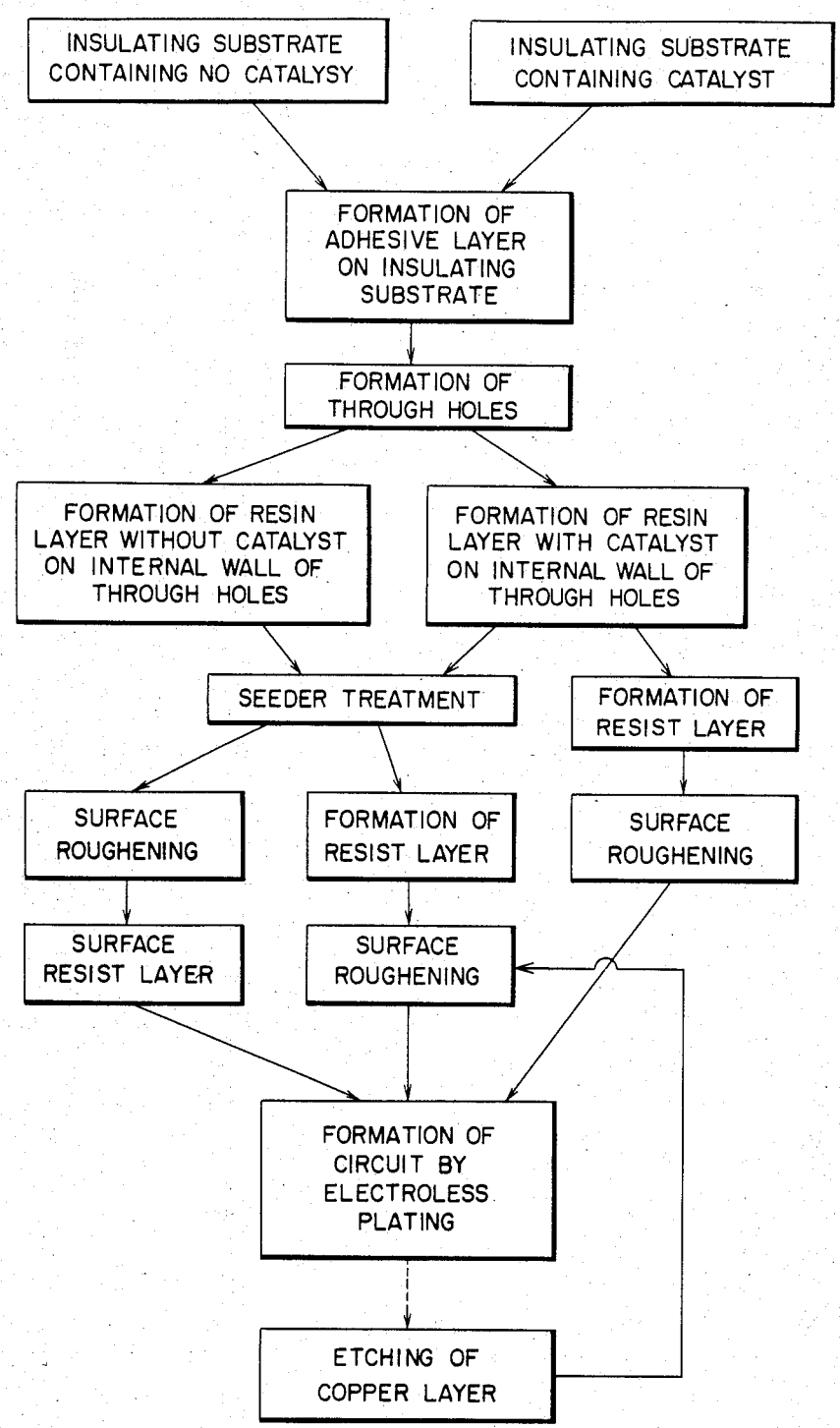
FIG. 1 is a simplified flow sheet of typical procedures in the process of this invention.

The process of this invention is explained with reference to the drawings.

First, an adhesive layer 2 is formed on one or both sides of an insulating substrate 1 (FIG. 1, FIG. 2(a), FIG. 3(a) and FIG. 4(a)).

As the insulating substrate 1, there can be used conventional paper-phenol resin, paper-epoxy resin, glass-epoxy resin, glass-polyimide resin, a composite material of glass-epoxy resin and paper-epoxy resin, and a composite material of glass-epoxy resin and glass mat. Usually, an insulating substrate having a thickness of 0.8 to 1.5 mm is used. The insulating substrate may contain a catalyst for plating.

The adhesive layer 2 usually has a thickness of 15 to 30 μm. As the adhesive, there can be used mixtures of rubbers such as nitrile rubber, styrenebutadiene rubber (SBR), chlorinated polyethylene rubber and chlorosulfonated polyethylene rubber, and thermosetting resins such as phenol resins and epoxy resins. The adhesive may contain fillers such as zirconium silicate, silica, alumina, calcium carbonate and the like. The adhesive should contain a catalyst for plating.

As a method for forming the adhesive layer, a conventional method such as coating or the like may be employed.

Thereafter, holes 3 as through holes are formed in the substrate by an ordinary method such as punching or drilling (FIG. 1, FIG. 2(b), FIG. 3(b) and FIG. 4(b)).

After the formation of the through holes 3, the surfaces of the insulating substrate 1 are cleaned and the substrate dust produced by punching is removed by high pressure washing with water.

Thereafter, a thermosetting resin layer 4 having a thickness of about 2 to 10 μm is formed on the internal walls of the through holes (FIG. 1, FIG. 2(c), FIG. 3(c) and FIG. 4(c)). Concretely, it can be obtained by immersing the insulating substrate 1 after washed with water in a thermosetting resin liquid or spraying the thermosetting resin liquid on the substrate, and then drying the substrate.

A catalyst for plating should not always be incorporated into the thermosetting resin liquid when the seeder treatment (treatment of adhering a catalyst for plating) is carried out in a subsequent step, but the catalyst should previously be incorporated into the thermosetting resin liquid when no seeder treatment is carried out.

The term "catalyst for plating" as used herein refers to a medium which can conduct a catalytic reaction in the reduction of the metal cations dissolved in an electroless metal deposition bath. As such catalysts, there can be used palladium, platinum, nickel, cobalt, iron, copper, manganese, chromium, molybdenum, tungsten, titanium, tin, silver, mixtures thereof and certain salts thereof.

In this invention, palladium and a mixture of palladium and tin are particularly suitable from the viewpoint of the stable deposition of metal.

For example, when a palladium compound or a palladium series catalyst containing a palladium compound and a tin compound is used, the amount of the catalyst added is preferably 0.005 to 0.5 part by weight per 100 parts by weight of the resin. When it is less than 0.005 part by weight, the catalytic effect is small, while when it is more than 0.5 part by weight, the catalyst costs much, resulting in a large production cost. Therefore both of such amounts are not suitable for practical purposes.

Stannous chloride ($SnCl_2$) has a function of removing chlorine from palladous chloride ($PdCl_2$) to form palladium which has a function as catalyst for plating. In the catalyst $SnCl_2 + PdCl_2$, it is preferable to add $SnCl_2$ 5 to 40 times by weight as much as palladous chloride. When the amount of $SnCl_2$ added is less than 5 times, the amount of palladium produced is small, while when it is more than 40 times, the insulation resistance of the resin layer becomes too high. Therefore, both of such amounts are not preferable. When the catalyst for plating, $SnCl_2 + PdCl_2$ is used, the time required for metal to be deposited in the through holes in electroless plating in a subsequent step is about 30 minutes, which period is preferably about one-third as short as the time required in the conventional processes.

As the thermosetting resin, epoxy resins, urethane resins and polyester resins can be used alone or as a mixture thereof. The thermosetting resin may secondarily contain phenol resins, melamine resins, xylene resins, urea resins and the like. When the insulating substrate 1 is of phenol resin type or epoxy resin type, the use of epoxy resins as the thermosetting resin is preferable because of goodness in adhesiveness to the substrate.

As the epoxy resin, it is preferable to use those obtained by emulsifying a bisphenol type resin, a novolak type resin or a cycloaliphatic compound or those obtained by introducing a hydrophilic group to their terminal groups to form a water-soluble salt.

As the thermosetting resin liquid, there may be used the above-mentioned thermosetting resins in the form of emulsion or non-aqueous emulsion in organic solvent. In this case, an emulsifier for emulsions may be used. As the emulsifier for epoxy resin emulsions, nonionic surface active agents and cationic surface active agents can be used. Since the liquid become acidic when palladium chloride, tin chloride or the like is added, cationic surface active agents are suitable. Concretely, amine salts and quaternary ammonium salts of fatty acids and the like can mainly be used.

The solid concentration in the thermosetting resin liquid is preferably adjusted to 0.3 to 5% by weight, and the viscosity also is preferably kept low. When the solid concentration is too high or the viscosity of the resin liquid is too high, the through holes are undesirably not impregnated with the resin liquid sufficiently or are plugged. Further, the penetration of the resin liquid into cracks formed in the internal walls of the through holes becomes insufficient, so that the repair of these cracks becomes insufficient. On the other hand, when the solid concentration is too low, the resulting resin layer is too thin, so that the effect of preventing the blow-hole is small.

The thermosetting resin liquid may contain a conventional curing agent for thermosetting resins, for example, an amine series compound. When an epoxy resin is used, aromatic polyamines such as benzyldimethylamine, tris(dimethylaminomethyl)phenol, methaphenylenediamine, diaminodiphenylmethane and xylylenediamine are preferred as the curing agent from the viewpoint of heat resistance, chemical resistance, workability and the like.

The thermosetting resins such as epoxy resins, polyester resins, polyurethane and the like are highly resistant to roughening solutions (which are used for roughening the adhesive surface to increase its adhesiveness). But when the roughening solution is increased in activity so much as to dissolve the thermosetting resins, the adhesive and the plating resist film are attached so seriously that a problem is caused in practical use. As additives necessary for roughening the resin surface with a relatively mild roughening solution, rubbers having butadiene moieties such as acrylonitrile-butadiene rubber, styrene-butadiene rubber, isobutylene rubber, natural rubber and the like may be added. From the viewpoint of emulsion stability, acrylonitrile-butadiene rubber and styrene-butadiene rubber are preferred.

The same effect is brought about by addition of a filler soluble in the roughening solution. The filler includes silica, calcium carbonate, sodium silicate, sodium sulfate, etc., though it is preferable to use calcium carbonate from the viewpoint of insulating property and the like.

After the insulating substrate 1 is immersed in the emulsion, the emulsion on its surface is removed by means of a squeezing roller or buff. After the removal of the emulsion on the surface, the thermosetting resin adhered to the hole walls is heated and dried into a desired cured state (half-cured, almost completely cured or the like) by using hot air with a spontaneous convection current or hot air (preferably 80 to 120° C.) which is compulsorily circulated by means of an electric fan or the like. The velocity of the hot air is preferably 5.5 m/sec or less, more preferably 5.0 m/sec or less. The temperature of the hot air may properly be selected in consideration of the curing temperature of the resin used.

After a thermosetting resin layer 4 containing a catalyst for plating is formed on the internal walls of the holes 3 of the insulating substrate 1, a desired circuit is built up by electroless plating treatment according to a conventional method. This procedure can be carried out, as shown in FIG. 1, by employing various combinations.

Figure 2A:
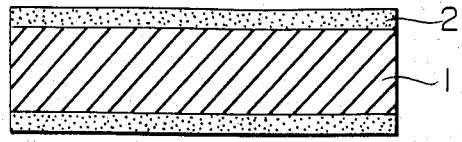
FIGS. 2 to 4 are fragmented cross-sections showing individual steps of the production process of a printed circuit board in accordance with embodiments of this invention.
Figure 2B:
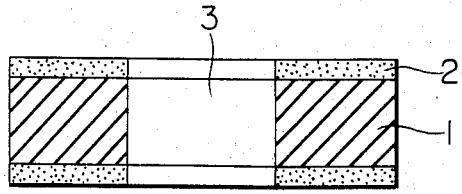
Figure 2C:
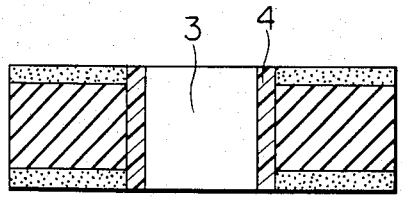
Figure 2D:
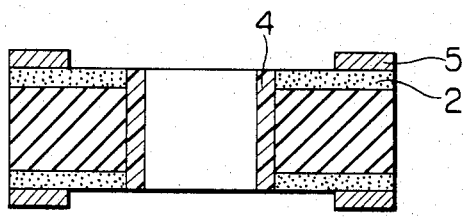
Figure 2E:
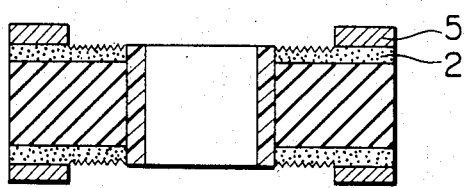
Figure 2F:
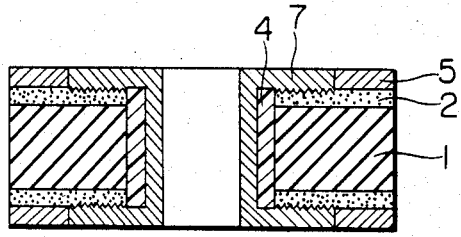

A first method, as shown in FIG. 2(d) through FIG. 2(f), comprises resist layer formation, surface roughening, and electroless plating. That is to say, after a thermosetting resin layer 4 containing a catalyst for plating is formed on the internal walls of through holes 3 of an insulating substrate 1 containing a catalyst for plating, a plating resist ink is applied in the form of a predetermined pattern and dried to form, as shown in FIG. 2(d), a conventional plating resist layer 5. After the formation of the plating resist layer 5, the insulating substrate 1 is immersed in a conventional roughening solution composed of, for example, a borofluoric acid solution or a chromic anhydride-sulfuric acid type solution to roughen, as shown in FIG. 2(e), the adhesive layer 2. After the roughening of the adhesive layer 2, the insulating substrate 1 is immersed in a conventional electroless copper plating solution, and copper is deposited in the form of a predetermined pattern to build up, as shown in FIG. 2(f), a circuit 7. After the building-up of the circuit 7, the insulating substratum 1 is treated or laminated by a conventional method to produce a desired printed circuit board.

The above method was explained for the case of using the insulating substrate containing a catalyst for plating, but an insulating substratum containing no catalyst for plating can also be used in the same manner as above as shown in FIG. 1.

Figure 3A:
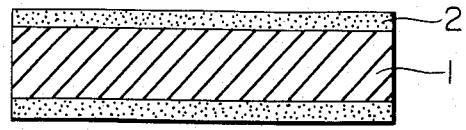
Figure 3B:
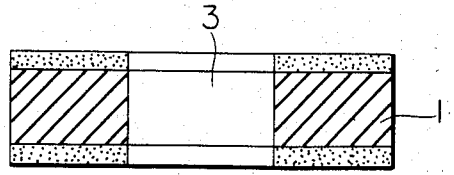
Figure 3C:
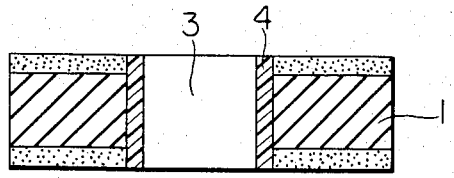
Figure 3D:
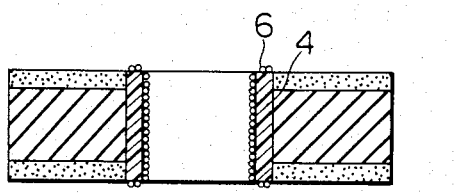
Figure 3E:
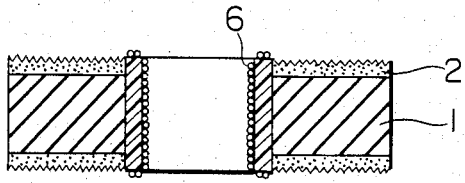
Figure 3F:
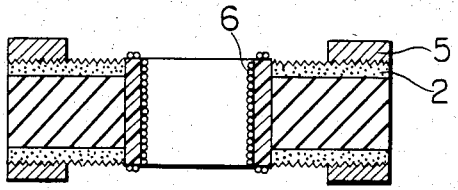
Figure 3G:
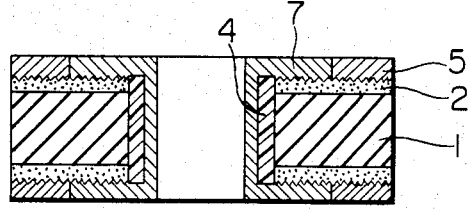

A second method, as shown in FIG. 3(d) through FIG. 3(g), comprises the so-called seeder treatment (adhesion of catalyst for plating), surface roughening, resist layer formation and electroless plating. That is to say, an insulating substrate 1 is immersed in a solution of a thermosetting resin 4 containing a catalyst for plating and the thermosetting resin is half-cured, after which a seeder 6 is adhered as shown in FIG. 3(d), and the insulating substrate is taken out and the thermosetting resin layer 4 is heated to be cured. After the curing of the thermosetting resin layer 4, the insulating substrate 1 is immersed in a roughening solution composed of, for example, a borofluoric acid solution or a chromic anhydride-sulfuric acid type solution to roughen, as shown in FIG. 3(e), the adhesive layer 2. After the roughening, the adhesive layer 2 is dried, plating resist ink is applied to the surface of the adhesive layer 2 in the form of a predetermined pattern and dried to form a plating resist layer 5 as shown in FIG. 3(f). After the formation of the plating resist layer 5, the insulating substrate 1 is immersed in an electroless copper plating solution, and copper is deposited in the form of a predetermined pattern to built up, as shown in FIG. 3(g), a circuit 7. After the building-up of the circuit 7, the insulating substrate 1 is treated by a conventional method to produce a desired printed circuit board.

The above method can be practised in the same manner whether the insulating substrate 1 contains a catalyst for plating or not.

Figure 4A:
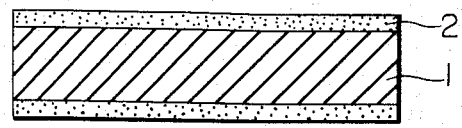
Figure 4B:
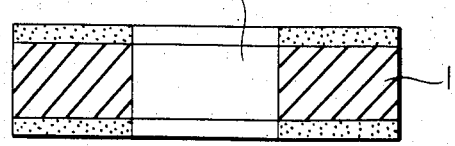
Figure 4C:
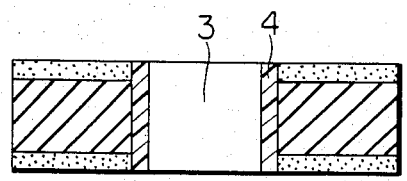
Figure 4D:
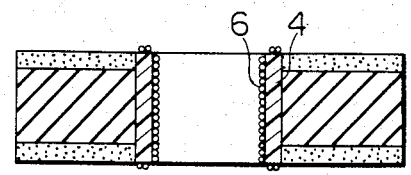
Figure 4E:
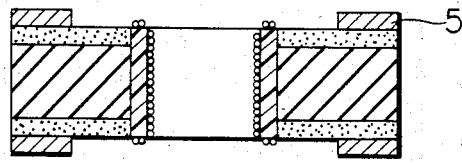
Figure 4F:
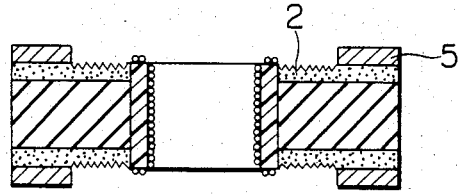
Figure 4G:
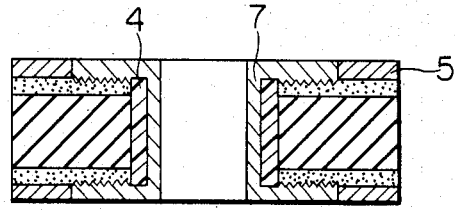

A third method, as shown in FIG. 4(d) through FIG. 4(g), comprises seeder treatment, resist layer formation, surface roughening, and electroless plating. That is to say, an insulating substrate 1 is immersed in a solution of a thermosetting resin containing a catalyst for plating, and the thermosetting resin is half-cured, after which the insulating substrate 1 is immersed in a solution of a catalyst for plating to adhere, as shown in FIG. 4(d), a seeder 6 to the surface of the thermosetting resin layer 4. After the adhesion of the seeder 6 to the surface of the thermosetting resin layer 4, a plating resist ink is applied in the form of a predetermined pattern and dried to form, as shown in FIG. 4(e), a plating resist layer 5 and at the same time the thermosetting resin layer 4 is cured. After the formation of the plating resist layer 5, the insulating substrate 1 is immersed in a roughening solution composed of, for example, a borofluoric acid solution or a chromic anhydridesulfuric acid type solution to roughen, as shown in FIG. 4(f), the adhesive layer 2. After the roughening of the adhesive layer 2, the insulating substrate 1 is immersed in an electroless copper plating solution, and copper is deposited in the form of a predetermined pattern to build up, as shown in FIG. 4(g), a circuit 7. After the formation of the circuit 7, the insulating substrate 1 is treated by a conventional method to produce a desired printed circuit board.

The above method can be practised in the same manner whether the insulating substrate 1 contains a catalyst for plating or not.

An explanation was given above for the case of forming a resin layer containing a catalyst for plating on the internal walls of the through holes, but in this invention, it is also possible to form a resin layer containing no catalyst for plating on the internal walls of the through holes. In this case, it is necessary to carry out, as shown in FIG. 1, the seeder treatment without fail after the formation of the resin layer containing no catalyst for plating.

When the formation of the circuit 7 (a copper layer) of the circuit board is unsatisfactory, it is sufficient that as shown in FIG. 1, after the copper layer is removed by etching, the surface is again roughened, followed by formation of a circuit by electroless plating. In this case, as a solution for the etching, an aqueous solution of ferric chloride and the like can be used.

According to this invention, a thermosetting resin layer with or without a catalyst for plating is previously formed uniformly on the internal walls of through holes provided in the insulating substrate, and can be maintained in a sufficiently and wholy adhered state thereon with half-cured or cured state by using, if necessary, hot air with a moving velocity so as not to remove the resin. Therefore, the adhesion of the thermosetting resin layer to the hole walls is stronger than the case wherein the seeder adheres directly to the hole walls, and such an effect is remarkable particularly when the catalyst for plating is adhered to the uncured thermosetting resin layer. Accordingly, even when the insulating substrate is then immersed in the roughening solution, the thermosetting resin layer is not peeled off easily. Therefore, the plated layer with sufficient thickness can be formed on the internal walls of through holes in a short time by the electroless plating treatment. Moreover, since the gas in the insulating substrate can be prevented by the thermosetting resin layer from being liberated through the hole walls, the blow-hole can be prevented from occuring at the time of thereafter carrying out solder dipping treatment. When a plating resist layer is formed after forming the thermosetting resin layer containing a catalyst for plating, the catalyst for plating does not adhere to the surface of the plating resist layer, so that there can be prevented a problem of short-circuit between circuits caused by deposition of metal on the surface of the plating resist. Further, since the catalyst for plating adhered to the adhesive surface can be removed by the pretreatment, i.e., the step of putting the surface in good condition with buff or the like, the insulation resistance between circuits can be maintained at a sufficiently high value even when a plating resist layer is formed. In addition, even in the case of unsatisfactory plating wherein copper once deposited is removed by etching and roughening treatment and electroless plating treatment are carried out again to reproduce a circuit board, a large amount of the seeder remains, so that there is no serious influence on decomposition of metal on the hole walls; therefore the metal can deposit on the hole walls sufficiently and no plating voids are formed. Accordingly, the blow-hole hardly occurs.

This invention is explained by way of the following Examples, in which all parts and percents are by weight unless otherwise specified.

EXAMPLE 1

A printed circuit board was produced according to the steps shown in FIG. 2(a) through FIG. 2(f) (Run No. 1-1). That is to say, a paper-epoxy resin laminate containing a catalyst for plating (mainly Pd compound) was used as an insulating substrate 1, and an adhesive (nitrilebutadiene rubber (NBR) and phenol resin as main components) containing a catalyst for plating (a chelate compound of palladium) was applied thereto and cured to form an adhesive layer 2. Next, the substrate 1 was punched to form holes 3 as predetermined through holes, after which the surface of the insulating substrate was put in good condition and washed with water under high pressure to remove the substrate dust produced by the punching. A thermosetting resin layer 4 was formed in the following manner. After the substrate was immersed in a liquid with a concentration of 1% prepared by dispersing 20 parts of calcium carbonate and 5 parts of a catalyst for plating (by dispersing and adhering metallic palladium onto the surface of a fine powder support of aluminum silicate) in an epoxy resin emulsion (100 parts of solid content) (prepared by adding 80 parts of an amine curing agent (EB-1) for epoxy resin to 100 parts (solid content) of a bisphenol type epoxy resin (Epolsion EA-1). Then, the emulsion on the adhesive surface was removed with buffing and the substrate was dried at 100° C. for 10 seconds to form a resin layer 4 of 4 μm in thickness. Thereafter, a plating resist ink containing an epoxy resin as a main component was screenprinted and then dried and cured at 160° C. for 30 minutes to form a plating resist layer 5. Subsequently, the substrate was immersed in a roughening solution containing chromic anhydride, sulfuric acid and sodium fluoride and washed to conduct surface roughening. Then, the substrate subjected to the above-mentioned treatments was immersed in an electroless copper plating solution of the following composition and a copper circuit 7 of 30 μm in thickness was formed.

| Copper sulfate ($CuSO_4.5H_2O$) | 7 g/liter |
| Formaldehyde | 3 ml/liter |

-continued

| Sodium ethylenediaminetetracetate | 25 g/liter |
| Sodium cyanide | 30 mg/liter |
| pH | 12.0 |
| Temperature | 70° C. |

In Run No. 1-2, the same procedure as in Run No. 1-1 was repeated, except that nitrile-butadiene rubber (Hycar-1522 mfd. by Japanese Geon Co., Ltd.) was added in an amount of 10 parts per 100 parts (in terms of solid resin content) of the thermosetting resin in Run No. 1-1.

In Run No. 1-3, the same procedure as in Run No. 1-2 was repeated, except that there was used the same thermosetting resin composition as in Run No. 1-2 except for omission of calcium carbonate.

In Run No. 1-4, the same procedure as in Run No. 1-1 was repeated, except that a borofluoric acid solution was used in place of the roughening solution used in Run No. 1-1.

In Run No. 1-5, the same procedure as in Run No. 1-1 was repeated, except that the thermosetting resin layer forming step in Run No. 1-1 was omitted.

In Run No. 1-6, the same procedure as in Run No. 1-1 was repeated, except that a seeder treatment (seeder: $PdCl_2 + SnClhd 2$)was carried out in place of the thermosetting resin layer forming step in Run No. 1-1.

Adhesiveness of the plated layer on through hole walls, through hole reliability and generation of the blow-hole were measured for the thus obtained printed circuit boards. The results are shown in Table 1.

TABLE 1

| Run No. | Adhesiveness (min) | Reliability (cycles) | Blow-hole (%) |
| --- | --- | --- | --- |
| 1-1 | 30 | 110 | 0.2 |
| 1-2 | 30 | 120 | 0.3 |
| 1-3 | 40 | 120 | 0.3 |
| 1-4 | 15 | 130 | 0.2 |
| 1-5 | No adhesion | — | — |
| 1-6 | 90 | 70 | 4 |

The adhesiveness of the plated layer on the through hole walls was evaluated by the time required for the metal to deposit on the whole through hole walls. The through hole reliability was evaluated by the number of cycles required for increasing the resistance value of 10% according to MIL-107D (a thermal shock test repeating a cycle of at −65° C. for 30 minutes and at +125° C. for 30 minutes). The generation of blow-hole was evaluated by observing with the naked eye after dipped in solder at 240° C. for 5 seconds.

As is evident from Table 1, according to this invention (Run Nos. 1-1 to 1-4), the adhesiveness of plated layer to the through holes becomes two times or more faster, the through hole reliability becomes about 1.6 times or more higher, and the generation of blow-hole is reduced to about one-thirteenth or less as compared with the conventional processes (Run Nos. 1-5 and 1-6). Thus, all the characteristics are greatly improved.

EXAMPLE 2

The same procedure as in Example 1, Run No. 1-1 was repeated, except that an emulsion having the following composition was used as a thermosetting resin emulsion and that a solution having the following composition was used as a roughening solution (Run No. 2-1).

Emulsion: a liquid with a concentration of 1% consisting of an epoxy resin emulsion prepared by adding the amine curing agent (EB-1) for epoxy resin to Epolsion EA-1 in an amount of 80 parts per 100 parts (in terms of solids) of the latter and adding palladous chloride and stannous chloride to the resulting mixture in amounts of 0.05 part and 1.0 part, respectively, per 180 parts of the mixture.

Roughening solution: a borofluoric acid solution.

In Run No. 2-2, the same procedure as in Run No. 2-1 was repeated, except that there was used the same emulsion as in Run No. 2-1 except for adding stannous chloride in an amount of 10 parts to 1 part of palladous chloride.

In Run No. 2-3, the same procedure as in Run No. 2-1 was repeated, except that the palladous chloride concentration in Run No. 2-1 was changed to 3 parts per 100 parts of the resin content.

In Run No. 2-4, the same procedure as in Run No. 2-1 was repeated, except that a paper-epoxy resin laminate as an insulating substrate containing no catalyst for plating was used in place of the substrate used in Run No. 2-1.

The adhesiveness, the generation of blow-hole and the through hole reliability were measured for the thus obtained printed circuit boards. The results are shown in Table 2.

TABLE 2

| Run No. | Adhesiveness [min] | Blow-hole [%] | Reliability [cycles] |
|---------|---------|---------|---------|
| 2-1 | 20 | 0.2 | 150 |
| 2-2 | 25 | 0.3 | 150 |
| 2-3 | 60 | 4.0 | 75 |
| 2-4 | 15 | 0.2 | 150 |
| 1-6 | 90 | 4 | 70 |

As is evident from Table 2, according to this invention (Run Nos. 2-1 to 2-4), the adhesiveness on the through holes becomes faster, the generation of blow-hole is reduced to one-thirteenth, and the through hole reliability is improved by a factor of 2 or more as compared with the conventional process (Run No. 1-6). Thus, all the characteristics are greatly improved. When the proportion of tin to palladium is lowered, the adhesiveness is lowered.

EXAMPLE 3

The same procedure as in Example 1, Run No. 1-1 was repeated, except that the thermosetting resin layer forming step and the roughening step were carried out in the following manner (Run No. 3-1).

Thermosetting resin layer forming step: A substrate was immersed in a liquid with a concentration of 1% prepared by adding a palladium liquid to an epoxy resin emulsion (prepared by adding the amine curing agent EB-1 to Epolsion EA-1 in an amount of 80 parts per 100 parts (in terms of solids) of the latter) so that the palladium concentration became 0.03 part per 100 parts of the resin, after which the emulsion on the adhesive surface was removed with buffing, and the substrate was heated by spontaneous convection current of air heated to about 100° C.

Roughening step: The surface of adhesive layer was roughened with a borofluoric acid roughening solution and washed.

In Run No. 3-2, the same procedure as in Run No. 3-1 was repeated, except that nitrile-butadiene rubber (Hycar-1522) was added in an amount of 10 parts per 100 parts (in terms of resin) of the thermosetting resin used in Run No. 3-1.

In Run No. 3-3, the same procedure as in Run No. 3-1 was repeated, except that a sodium fluoridechlomic acid mixed solution was used in place of the roughening solution used in Run No. 3-1.

In Run No. 3-4, the same procedure as in Run No. 3-1 was repeated, except that after removing the emulsion, heating with hot air heated to about 100° C. and having a velocity of 3 m/sec was conducted in the thermosetting resin layer forming step.

In Run No. 3-5, the same procedure as in Run No. 3-1 was repeated, except that after removing the emulsion, heating with hot air heated to about 100° C. and having a velocity of 4.5 m/sec was conducted in the thermosetting resin layer forming step.

In Run No. 3-6, the same procedure as in Run No. 3-1 was repeated, except that after removing the emulsion, heating with hot air heated to about 100° C. and having a velocity of 5 m/sec was conducted in the thermosetting resin layer forming step in Run No. 3-1.

In Run No. 3-7, the same procedure as in Run No. 3-1 was repeated, except that after removing the emulsion, heating with hot air heated to about 100° C. and having a velocity of 5.5 m/sec was conducted in the thermosetting resin layer forming step.

The adhesiveness on the through hole walls, the through hole reliability and the generation of blow-hole were measured for the thus obtained printed circuit boards. The results are shown in Table 3.

TABLE 3

| Run No. | Adhesiveness (min) | Reliability (cycles) | Blow-hole (%) |
|---------|---------|---------|---------|
| 3-1 | 15 | 100 | 0.30 |
| 3-2 | 13 | 100 | 0.25 |
| 3-3 | 15 | 100 | 0.30 |
| 3-4 | 15 | 100 | 0.30 |
| 3-5 | 18 | 100 | 0.30 |
| 3-6 | 19 | 100 | 0.30 |
| 3-7 | 25 | 100 | 0.30 |
| 1-6 | 90 | 70 | 4 |

As is evident from Table 3, according to this invention (Run Nos. 3-1 to 3-7), the time necessary for the adhesiveness is reduced to half or less, the metal deposition rate is increased, the through hole reliability is improved by a factor of about 1.4 or more, and the generation of blow-hole is reduced to one-thirteenth as compared with the conventional process (Run No. 1-6). Further, it is apparent that according to this invention, the adhesiveness is deteriorated when the velocity of hot air exceeds 5.5 m/sec. Therefore, the hot air velocity is preferably 5 m/sec or less.

EXAMPLE 4

A printed circuit board was produced according to the steps shown in FIG. 3(a) through FIG. 3(g) (Run No. 4-1).

(a) Insulating substrate processing step: The same paper-epoxy resin laminate as used in Example 1 Run No. 1-1 was used as an insulating substrate 1, and an adhesive (NBR and phenol resin as main components) containing a catalyst for plating (a chelate compound of palladium) was applied thereto and cured to form an adhesive layer 2.

(b) Formation of through holes: The substrate 1 was punched to form holes 3 as predetermined through holes, after which the surface of the insulating substrate was put in good condition and washed with water under high pressure to remove the substrate dust produced by the punching.

(c) Thermosetting resin layer forming step: The substrate was immersed in an epoxy resin emulsion (prepared by adding the amine curing agent EB-1 to Epolsion EA-1 in an amount of 80 parts per 100 parts (in terms of solids) of the latter and diluting the resulting mixture to a concentration of 1%), after which the emulsion on the surface of the adhesive layer was removed with buffing, and the substrate was heated at a temperature of 100° C. for 10 minutes.

(d) Step of adhering a catalyst for plating: The same catalyst for plating as used in Example 1, Run No. 1-6 was coated and heated at a temperature of 150° C. for 30 minutes.

(e) Roughening step: The surface of the adhesive layer was roughened with a borofluoric acid solution, washed, and then dried.

(f) Plating resist formation step: A plating resist ink containing an epoxy resin as a main component was screen-printed and then cured by heating at a temperature of 160° C. for 30 minutes.

(g) Electroless plating step: A copper layer having a thickness of 30 μm was formed by the same electroless plating treatment as in Example 1.

In Run No. 4-2, the same procedure as in Run No. 4-1 was repeated, except that the roughening step of (e) in Run No. 4-1 was conducted before the sdeder adhering step of (d).

The adhesiveness, the generation of blow-hole, insulation properties at moisture absorbed state and metal deposition on the surface of plating resist layer were measured for the thus obtained printed circuit boards.

TABLE 4

| Run No. | Adhesiveness (min) | Blow-hole (%) | Insulation*1 properties (Ω) | Metal*2 deposition |
|---|---|---|---|---|
| 4-1 | 10 | 0.2 | $10^{11}$ | Hardly occurred |
| 4-2 | 20 | 0.5 | $10^{8}$ | Hardly occurred |
| 1-6 | 90 | 4 |  | occurred |

(Note)
*1Insulation properties at moisture absorbed state is insulation resistance measured after standing in an atmosphere of 40° C. and 90% RH for 7 days.
*2Metal deposition on the surface of plating resist layer was observed by the naked eye.

As is evident from Table 4, according to this invention (Run Nos. 4-1 and 4-2), the adhesiveness becomes faster and the generation of blow-hole is reduced to one-third or less as compared with the conventional process (Run No. 1-6). Moreover, the value of insulation properties at moisture absorbed state is sufficient for practical use. In addition, almost no metal deposits on the surface of the resist layer, so that a problem of short-circuit is prevented.

EXAMPLE 5

The same procedure as in Example 4 was repeated, except that the same adhesive containing a catalyst for plating, as used in Example 1, Run No. 1-1 was used and heating by spontaneous convection current of air heated to about 100° C. was conducted in the thermosetting resin layer forming step of the step (c) (Run No. 5-1).

TABLE 5

| Run No. | Adhesiveness (min) | Reliability (cycles) | Blow-hole (%) |
|---|---|---|---|
| 5-1 | 10 | 110 | 0.20 |
| 1-6 | 90 | 70 | 4 |

As is evident from Table 5, according to this invention (Run No. 5-1), the time required for the adhesiveness is clearly improved and the through hole reliability is improved by a factor of 1.6, and the generation of blow-hole is reduced to about one-twentieth as compared with the conventional process (Run No. 1-6). Further, the metal deposition rate was increased by a factor of 5 or more compared with the conventional process.

EXAMPLE 6

The same procedure as in Example 5 was repeated, except that, as shown in FIG. 4, roughening was conducted after forming a plating resist layer and the steps (c), (f) and (g) were conducted as follows (Run No. 6-1).

(c) Thermosetting resin layer forming step: A substrate was immersed in a liquid with a concentration of 1% prepared by adding a palladium liquid (a catalyst for plating which is a chelate compound of epoxy resin and palladium) to an epoxy resin emulsion (prepared by adding the amine curing agent EB-1 to Epolsion EA-1 in an amount of 80 parts per 100 parts (in terms of solids) of the latter) so that the palladium concentration might be 0.03 part per 100 parts of the resin, after which the emulsion on the adhesive surface was removed with buffing, and the substrate was heated by convection current of air heated to about 100° C.

(f) Roughening step: The surface of the adhesive layer was roughened with a borofluoric acid roughening solution, washed, and then dried.

(g) Electroless plating step: A copper layer was formed by electroless copper plating treatment and then removed with an aqueous ferric chloride solution, after which roughening treatment was carried out with a borofluoric acid roughening solution, and a copper layer having a thickness of 30 μm was again formed by electroless plating treatment.

In Run No. 6-2, the same procedure as in Run No. 6-1 was repeated, except that nitrile-butadiene rubber (Hycar 1522) was added in an amount of 10 parts to 100 parts (in terms of resin) of the thermosetting resin used in Run No. 6-1.

In Run No. 6-3, the same procedure as in Run No. 6-1 was repeated, except that a sodium-chromic acid mixture solution was used in place of the roughening solution used in Run No. 6-1.

In Run No. 6-4, the same procedure as in Run No. 6-1 was repeated, except that the step (c) in Run No. 6-1 was omitted.

The adhesiveness, the through hole reliability, and the generation of blow-hole were measured for the thus obtained printed circuit boards. The results are shown in Table 6.

TABLE 6

| Run No. | Adhesiveness (min) | Reliability (cycles) | Blow-hole (%) |
|---|---|---|---|
| 6-1 | 15 | 100 | 0.30 |
| 6-2 | 10 | 100 | 0.20 |
| 6-3 | 20 | 100 | 0.25 |

TABLE 6-continued

| Run No. | Adhesiveness (min) | Reliability (cycles) | Blow-hole (%) |
|---------|--------------------|-----------------------|---------------|
| 6-4 | 300 | 30 | 15 |

As is evident from Table 6, according to this invention (Run Nos. 6-1 to 6-3), the time required for the adhesiveness becomes shorter, the through hole reliability is improved by a factor of about 3 or more, and the generation of blow-hole is reduced to one-fiftieth or less as compared with the conventional process (Run No. 6-4).

What is claimed is:

1. In a process for producing a printed circuit board by forming a circuit on an insulating substrate having through holes by electroless plating, the improvement comprising forming an adhesive layer containing a catalyst for plating on one side or both sides of the insulating substrate, forming through holes in the substrate, and forming a thermosetting resin layer on the internal walls of the through holes before an electroless plating treatment.

2. A process according to claim 1, wherein the thermosetting resin layer contains a catalyst for plating.

3. A process according to claim 1, wherein the thermosetting resin layer contains no catalyst for plating, and after a thermosetting resin layer is formed, a catalyst for plating is adhered thereto.

4. A process according to claim 1, wherein the thermosetting resin layer is formed from an emulsion comprising as its main constituent an epoxy resin, a urethane resin, a polyester resin or a mixture thereof.

5. A process according to claim 2, wherein the catalyst for plating is a compound selected from the group consisting of Pd, Pt, Wi, Co, Fe, Cu, Mn, Cr, Mo, W, Ti, Sn, Ag and mixtures thereof.

6. A process according to claim 2, wherein after the thermosetting resin layer is formed, a catalyst for plating is further adhered thereto.

7. A process according to claim 2, wherein the thermosetting resin layer is formed by curing by using hot air having a velocity of 5 m/sec or less.

8. A process according to claim 2, wherein the catalyst for plating is a palladium compound and the palladium concentration is 0.005 to 0.5 part by weight per 100 parts by weight of the solid resin content.

9. A process according to claim 2, wherein the catalyst for plating is a mixture of palladium chloride and stannous chloride and the amount of stannous chloride is 5 to 40 times as much as that of palladium chloride.

10. A process according to claim 1, wherein the thermosetting resin layer is formed by using a thermosetting resin liquid having a solid content of 0.3 to 5% by weight.

* * * * *